United States Patent [19]
Park et al.

[11] Patent Number: 5,571,730
[45] Date of Patent: Nov. 5, 1996

[54] SEMICONDUCTOR DEVICE HAVING VERTICAL METAL OXIDE SEMICONDUCTORS AND A METHOD FOR MANUFACTURING THE SAME

[75] Inventors: Kyu-chan Park, Songtan; Tae-earn Shim, Seongnam; Seon-il Yu, Seoul, all of Rep. of Korea

[73] Assignee: Samsung Electronics Co., Ltd., Suwon, Rep. of Korea

[21] Appl. No.: 445,649

[22] Filed: May 22, 1995

Related U.S. Application Data

[62] Division of Ser. No. 298,470, Aug. 30, 1994.

[30]   Foreign Application Priority Data

Nov. 24, 1993  [KR]   Rep. of Korea .................. 93-25138

[51] Int. Cl.$^6$ .................. H01L 21/265; H01L 21/70; H01L 27/00
[52] U.S. Cl. .................. 437/21; 437/47; 437/48; 437/52; 437/919; 437/974
[58] Field of Search .................. 437/21, 47, 48, 437/52, 919, 974; 257/296

[56]   References Cited

U.S. PATENT DOCUMENTS

| | | | |
|---|---|---|---|
| 5,057,896 | 10/1991 | Gotou | 357/49 |
| 5,106,775 | 4/1992 | Kaga et al. | 437/52 |
| 5,281,837 | 1/1994 | Kohyama | 257/296 |
| 5,498,889 | 3/1996 | Hayden | 257/296 |

*Primary Examiner*—Mary Wilczewski
*Assistant Examiner*—Brian K. Dutton
*Attorney, Agent, or Firm*—Cushman Darby & Cushman, L.L.P.

[57]   ABSTRACT

A vertically structured transistor and method for manufacturing the same achieves a highly integrated semiconductor device. A pillar is vertically formed on a semiconductor substrate and forms a channel region of the transistor. A gate electrode is formed in a self-alignment fashion so as to surround the sides of the pillar with a gate insulating film imposed therebetween. A source region and a drain region are formed in a lower portion and an upper portion of the pillar, respectively. The area occupied by a transistor according to the present invention is remarkably reduced.

9 Claims, 13 Drawing Sheets

SEMICONDUCTOR DEVICE HAVING VERTICAL METAL OXIDE SEMICONDUCTORS AND A METHOD FOR MANUFACTURING THE SAME

This is a division of application Ser. No. 8/298,470, filed Aug. 30, 1994.

BACKGROUND OF THE INVENTION

The present invention relates to a highly integrated semiconductor device and a method for manufacturing the same. More particularly, it relates to a Metal Oxide Semiconductor (MOS) transistor having a vertical structure which enables increased integration, and a method for manufacturing the same.

It is important to place a maximum number of devices in a minimum cell area to increase integration. In particular, the increased integration of devices is important to increase the density of a semiconductor memory cell device, especially a dynamic random access memory (DRAM).

Conventional devices traditionally form a transistor in a lateral direction on a semiconductor substrate. However, the formation of source and drain regions and the gate of each transistor in such planar devices proves to be a major factor impeding a further reduction of the size of memory cells of such semiconductor memory devices. The continued reduction in the lateral size of planar-formed high capacity memory devices, such as 256 Mbit and higher, causes a deterioration in the electrical characteristics of the memory cells. Thus, it is substantially impossible to realize a semiconductor memory device of a continued higher capacity using the conventional planar layout.

In an attempt to overcome the disadvantages of the conventional planar layout, various memory cell structures have been proposed wherein a transistor and capacitor are formed on a semiconductor substrate in a vertical direction are proposed.

K. Sunouchi et al. suggest a Surrounding Gate Transistor (SGT) cell wherein all devices for the unit memory cell are formed in one silicon pillar isolated by a matrix-like trench. See K. Sunouchi et al., "A Surrounding Gate Transistor (SGT) Cell for 64/256 Mbit DRAMs", IEDM 1989. However, in this proposed SGT cell, the process of forming the silicon pillar and the capacitor are complex and the isolation characteristics are poor. Also, there is a large possibility that a short between a capacitor plate-node and a gate electrode will occur during the process forming the gate electrode.

Digh Hisamoto et al. suggest a Fully Depleted Lean-channel Transistor (DELTA) structure wherein a gate electrode having a silicon on insulator (SOI) structure is vertically formed. See Digh Hisamoto et al., "A Fully Depleted Lean-channel Transistor (DELTA)", IEDM 1989. The DELTA structure has effective channel controllability since the channel is formed on a vertical surface. However, an increase in the integration of such devices is limited since source and drain regions are laterally formed with respect to the gate.

Toshiyuki Nishihara et al. suggest a SOI structure cell wherein a capacitor is completely buried under a silicon layer, to maximize a memory cell area. See Toshiyuki Nishihara et al., "A Buried Capacitor DRAM Cell with Bonded SOI for 256 M and 1 Gbit DRAMs", IEDM 1992. However, in this SOI structure cell, it is difficult to control a remaining silicon layer thickness during the process of polishing a silicon substrate for forming the SOI structure. Moreover, this structure requires an additional bitline contact hole area for connecting a drain region of a transistor with the bitline.

SUMMARY OF THE INVENTION

Accordingly, it is an object of the present invention to provide a semiconductor device which solves the problems of the above-described conventional methods and which enables an increased integration.

It is another object of the present invention to provide a method for manufacturing a semiconductor device especially suitable for manufacturing a semiconductor memory device.

To accomplish the above and other objects of the present invention, a MOS transistor is provided which comprises a silicon pillar serving as a channel region. The silicon pillar is extended in a perpendicular (vertical) direction with respect to a semiconductor substrate and surrounded is with an insulating film. A gate insulating film is interposed between the silicon pillar and a gate electrode surrounding the silicon pillar. Impurity regions are formed in upper and lower portions of the silicon pillar to form the source and drain regions.

According to a preferred embodiment of the present invention, a first electrode is connected with the first impurity region formed in the lower portion of the pillar. A second semiconductor substrate is formed on the first electrode with an insulating layer imposed therebetween.

A method for manufacturing a MOS transistor is also provided, comprising steps of forming a first impurity region in a surface of a first semiconductor substrate. The first semiconductor substrate is etched to form silicon pillars. A space is filled between the pillars with an insulator, which is then etched to form a contact hole. A first electrode is formed on the insulator in contact with the first impurity region through the contact hole. A first insulating layer is formed and planarized. A second semiconductor substrate is attached to the planarized first insulating layer, and the back side of the first semiconductor substrate is etched back. A second impurity region is formed in a surface of the pillar, and the insulator is partially etched to expose the pillar. A gate insulating film and a gate electrode are sequentially formed so as to surround the pillar.

According to the present invention, the pillar formed vertically serves as a channel region of a transistor, with source and drain regions formed in upper and lower portions of the pillar. The gate electrode is formed so as to surround the pillar. Therefore, the area occupied by the transistor is remarkably reduced. Additionally, memory cell area is remarkably reduced using the MOS transistor structure according to the present invention, by vertically forming the transistor on the capacitor and by vertically forming the bitline contact hole on the transistor.

BRIEF DESCRIPTION OF THE DRAWINGS

The above objects and advantages of the present invention will become more apparent by describing in detail a preferred embodiment thereof with reference to the attached drawings, in which.

DETAILED DESCRIPTION OF THE INVENTION

The present invention will be explained in more detail with reference to the attached drawings.

Figure 1:
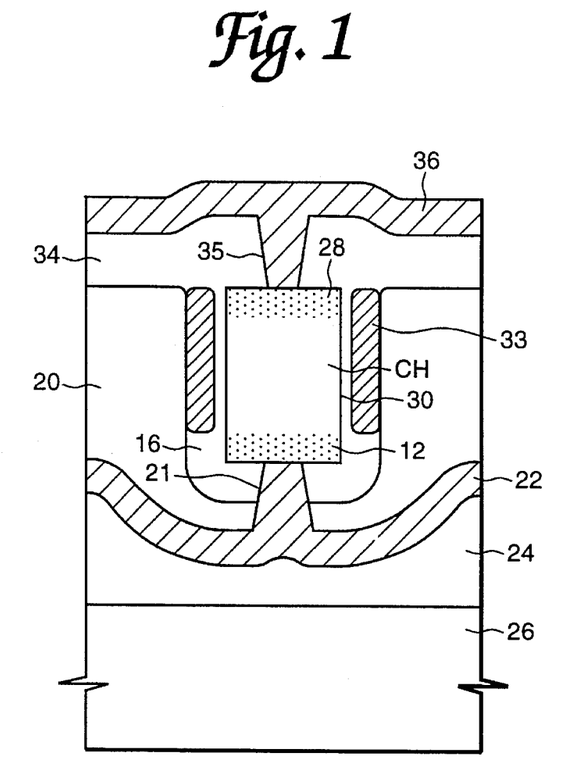
FIG. 1 is a cross-sectional view of a MOS transistor manufactured according to the present invention.
Figure 2:
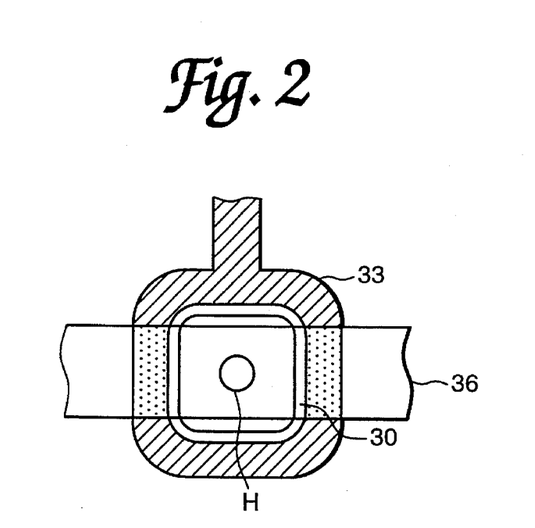
FIG. 2 is a plan view of a MOS transistor manufactured according to the present invention.

FIGS. 1 and 2 are a cross-sectional view and a plan view of a MOS transistor manufactured according to the present invention, respectively. FIG. 1 shows a MOS transistor according to the present invention wherein the device is first formed on a first semiconductor substrate 10 positioned at the top of FIG. 1. The device is turned over during the formation thereof and positioned as shown in FIG. 1.

A first semiconductor substrate is etched to form a pillar, which serves as a channel region (CH) of the MOS transistor. A drain region 28 and a source region 12 are formed in the upper portion and the lower portion of the pillar as shown in FIG. 1, respectively. A gate electrode 33 of the transistor is formed so as to surround the pillar, with a gate insulating film 30 imposed between the pillar and the gate electrode 33. A source wiring layer 22 is formed under the pillar as shown in FIG. 1 and connected to the source region 12. A second semiconductor substrate 26 is attached to the source wiring layer 22 with a first insulating layer 24 imposed therebetween, thereby constituting a SOI structure. A drain wiring layer 36 is formed on drain region 28 with a second insulating layer 34 imposed therebetween. The drain wiring layer 36 is connected to the drain region 28 through a contact hole (H).

The MOS transistor according to the present invention requires only the lateral area of the pillar surrounded by the gate electrode 33, and therefore the additional lateral area conventionally required is obviated. Thus, the integration of the semiconductor device is remarkably increased.

FIGS. 3 through 6 are cross-sectional views for illustrating a method for manufacturing a MOS transistor according to the present invention.

Figure 3:
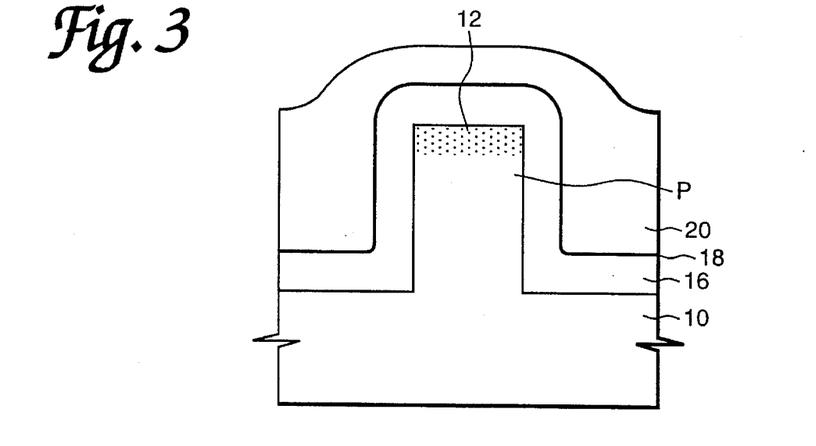
FIGS. 3 through 6 are cross-sectional views for illustrating a method for manufacturing a MOS transistor according to the present invention.

FIG. 3 shows the formation of a pillar P and first, second and third insulating films 16, 18 and 20.

First, impurity ions of a second conductivity type, e.g., N-type, are implanted on the entire surface of a first semiconductor substrate 10 of a first conductivity type, e.g., P-type, thereby forming a source region 12 of a transistor. Thereafter, first semiconductor substrate 10 is etched by a reactive ion etching (RIE) method, thereby forming a silicon pillar P of about 600 nm in height. Then, insulating materials, e.g., oxide and nitride, are sequentially deposited by a chemical vapor deposition (CVD) method on the resultant structure wherein the silicon pillar P is formed, thereby forming first and second insulating films 16 and 18. Then, an insulating material, e.g., an oxide, is deposited on the second insulating film 18 by a CVD method, thereby forming third insulating film 20 so as to fill the etched portions of first semiconductor substrate 10. Next, the surface of third insulating film 20 is planarized. The third insulating film 20 insulates the gate electrode 33 and a source wiring layer 22 formed in a subsequent process.

Figure 4:
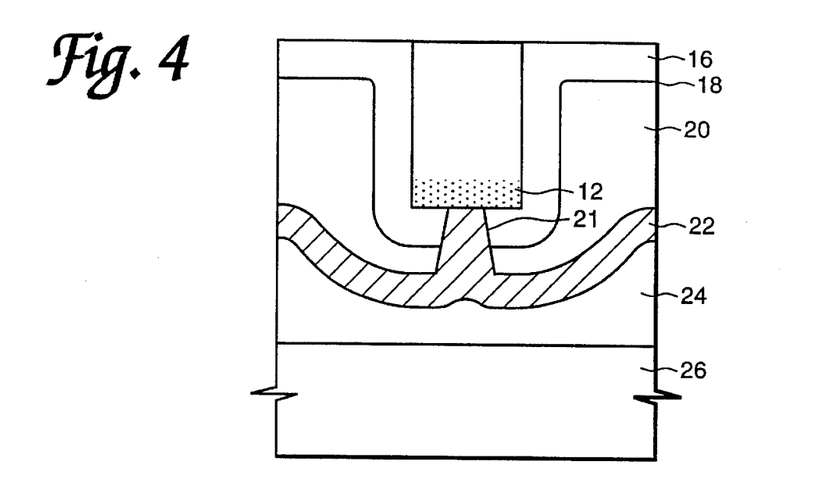

FIG. 4 shows the formation of a first contact hole 21, a source wiring layer 22 and a second semiconductor substrate 26. FIG. 4 is shown in an upside down position, which results from the steps described with reference to FIG. 4.

The third insulating film 20, second insulating film 18 and first insulating film 16 are sequentially etched by a lithography process, thereby forming first contact hole 21 exposing a portion of source region 12. Then, a conductive material is deposited on the entire surface of the resultant structure wherein the first contact hole 21 is formed, thereby forming source wiring layer 22, which is connected with source region 12 through the first contact hole 21. Next, after forming a first insulating layer 24 by depositing an insulating material on source wiring layer 22, the surface of first insulating layer 24 is planarized by an etch-back method. Then, a new wafer is attached on the planarized first insulating layer 24 by a direct wafer bonding method, thereby forming second semiconductor substrate 26. Next, after reversing the first semiconductor substrate 10 so as to turn the back side thereof upward, the back side of the first semiconductor substrate 10 is etched by an etching method such as a grinding/polishing or a plasma etching method. The above etching process proceeds until first insulating film 16 is exposed.

Figure 5:
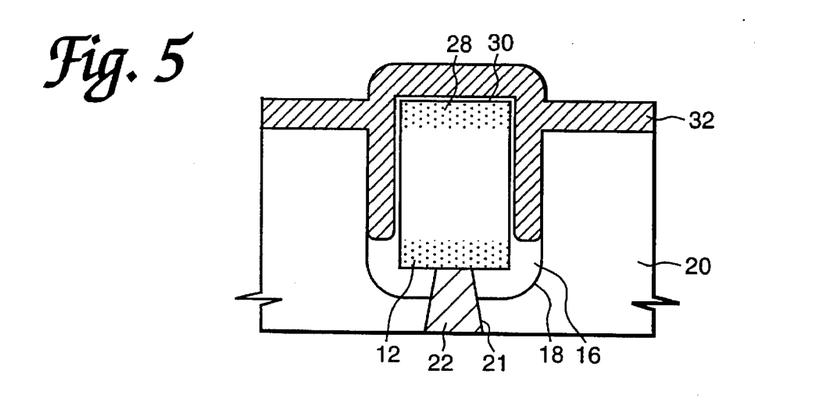

FIG. 5 shows the formation of a drain region 28 and a gate insulating film 30.

For example, N-type impurity ions are implanted on the etched back side of the first semiconductor substrate 10, thereby forming the drain region 28 of the transistor in the upper portion of the pillar P. Thereafter, the first insulating film 16 is isotropically etched using the second insulating film 18 as an etch-blocking layer so that the third insulating film 20 is not etched. Then, the pillar surface area exposed by the etching of the first insulating film 16 is oxidized by a thermal oxidation process, thereby forming gate insulating film 30. Then, a conductive material, e.g., an impurity-doped polysilicon, is deposited on the resultant structure wherein gate insulating film 30 is formed, thereby forming a conductive layer 32.

Figure 6:
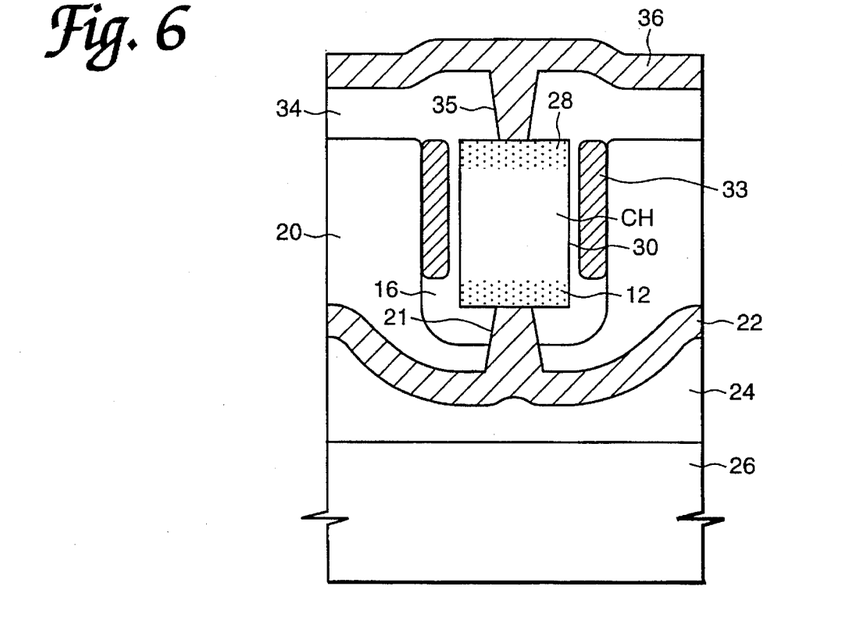

FIG. 6 shows the formation of a gate electrode 33, a second contact hole 35 and a drain wiring layer 36.

Conductive layer 32 is etched by an etch-back method, thereby forming gate electrode 33 surrounding the pillar. Then, after forming a second insulating layer 34 by depositing an insulating material on the entire surface of the resultant structure wherein gate electrode 33 is formed, the second insulating layer 34 is etched by a lithography process thereby forming the second contact hole 35. Thereafter, a conductive material is deposited on the entire surface of the resultant structure wherein the second contact hole 35 is formed, thereby forming a drain wiring layer 36 connected to the drain region 28 through the second contact hole 35.

According to the method for manufacturing a MOS transistor of the present invention, the lithography process forms the silicon pillar P (which serves as the channel region), the first and second contact holes, and the source and drain wiring layers. The gate electrode is formed in a self-alignment fashion. The method greatly increases the integration of a semiconductor device.

Figure 7:
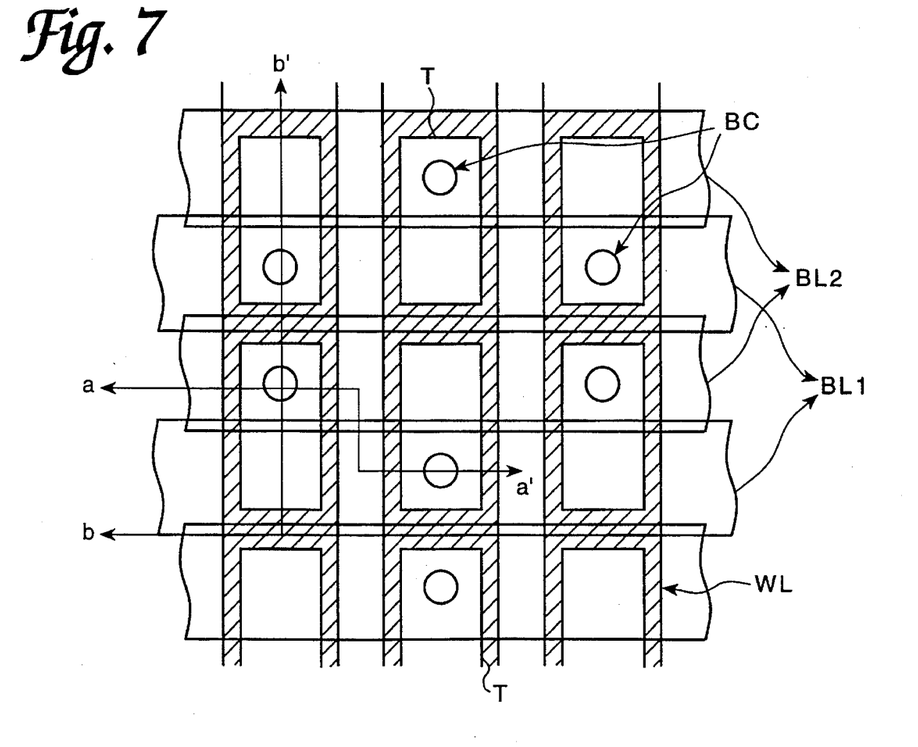
FIG. 7 is a plan view of a DRAM cell according to the present invention.

FIG. 7 is a plan view of a DRAM cell formed with a MOS transistor according to the present invention. Reference symbol WL indicates a wordline, T indicates a transistor, BC indicates a bitline contact hole, BL1 indicates a first bitline, and BL2 indicates a second bitline.

In a DRAM cell according to the present invention, transistor T is formed in a shape extended in the wordline direction. The bitline contact hole BC is located to one side of the center of the transistor T in the wordline direction. Multi-layered bitlines are formed, so that adjacent transistors in the word line direction are connected with first and second bitlines BL1 and BL2, respectively, which are located at different heights.

Figure 8:
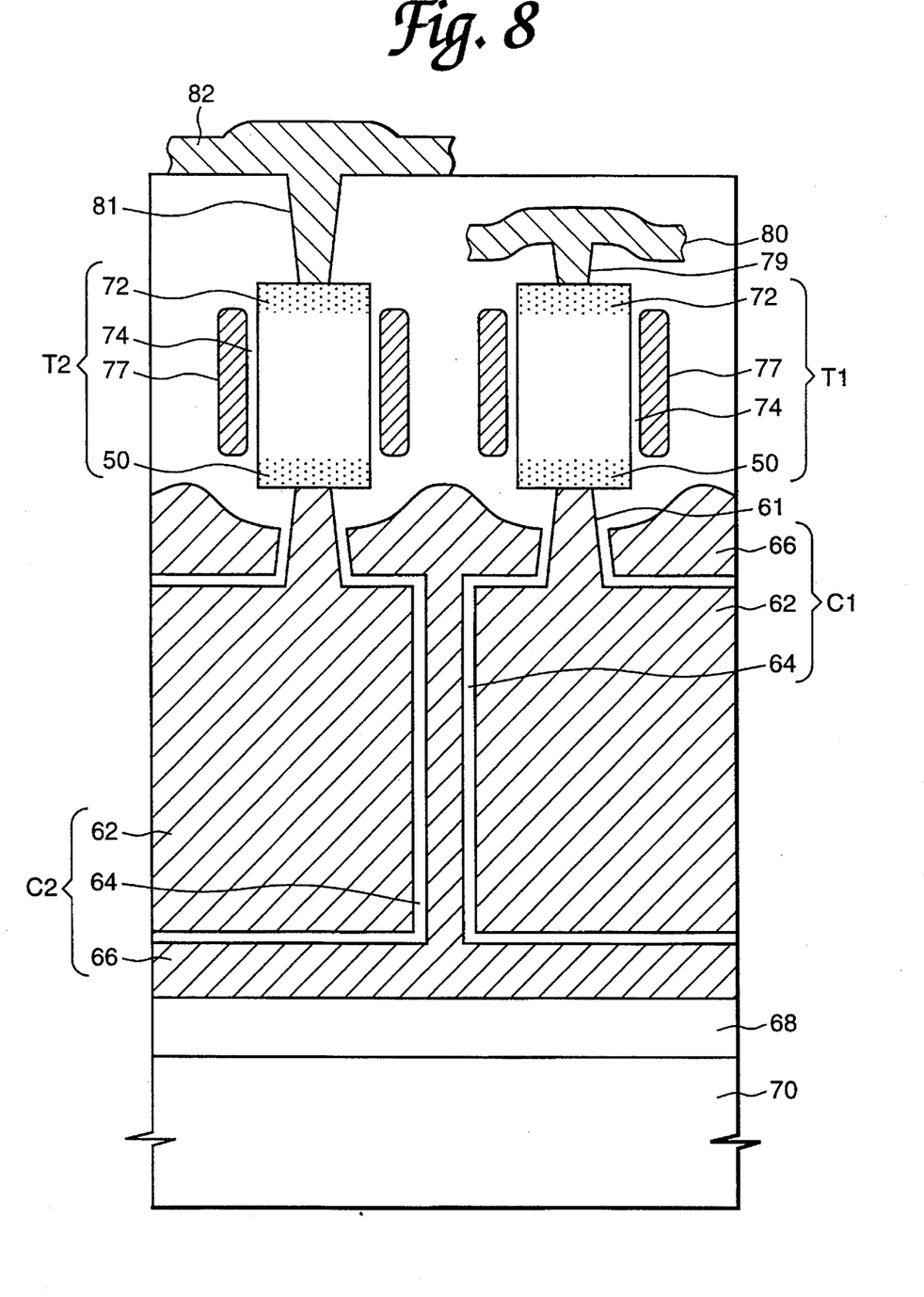
FIGS. 8 and 9 are cross-sectional views of a DRAM cell manufactured according to the present invention, taken along line a-a' and b-b' in FIG. 7, respectively.
Figure 9:
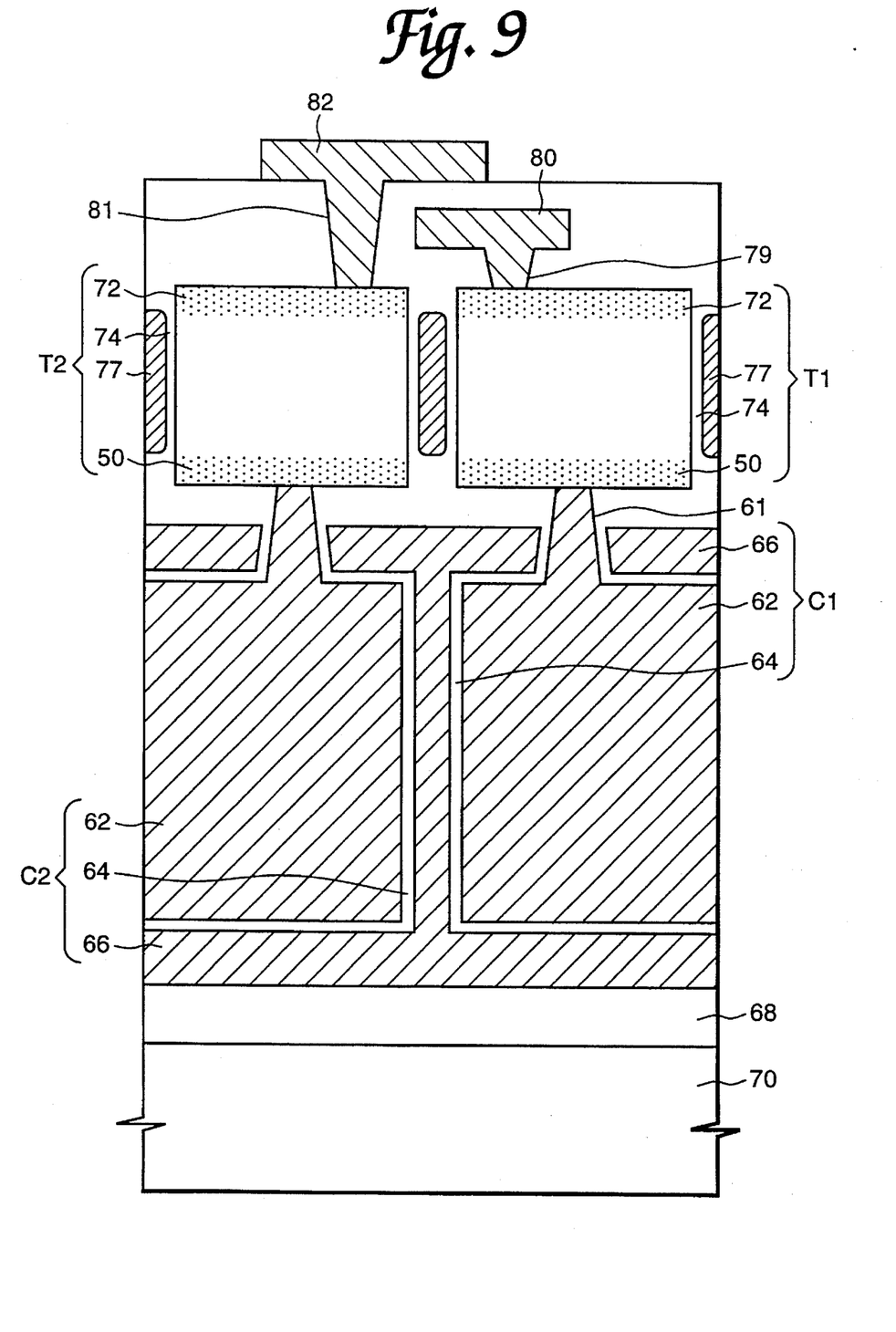

FIGS. 8 and 9 are cross-sectional views of a DRAM cell manufactured according to the present invention, taken along lines a-a' and b-b' in FIG. 7, respectively.

First and second transistors T1, T2 are formed with a vertical channel structure as described in FIG. 1. Capacitors C1 and C2 are formed under the first and second transistors T1, T2. The capacitors are comprised of storage electrodes 62 connected to the source regions 50 of the first and second transistors T1, T2. A plate electrode 66 surrounds the entire surface of the storage electrode 62, with a dielectric film 64 interposed therebetween. A first bitline 80 is connected to a drain region 72 of the first transistor T1, and a second bitline 82 is connected to a drain region 72 of the second transistor T2, thereby forming a multi-layered bitline structure. Thereby, adjacent transistors in the wordline direction are connected with bitlines located at alternating heights.

Transistors T1, T2 are formed so that they are isolated by an insulating material between the gate electrodes 33 in the bitline direction (see FIG. 8) and so that they share a gate electrode 77 in a direction which is perpendicular to the bitline direction, i.e., the wordline direction (see FIG. 9).

The cell area of the above-described structure can be reduced to 4F$^2$ (where F is a minimum feature size). For reference, the minimum cell area in the cell structure where the conventional planar transistor is used is 8F$^2$.

Figure 10A:
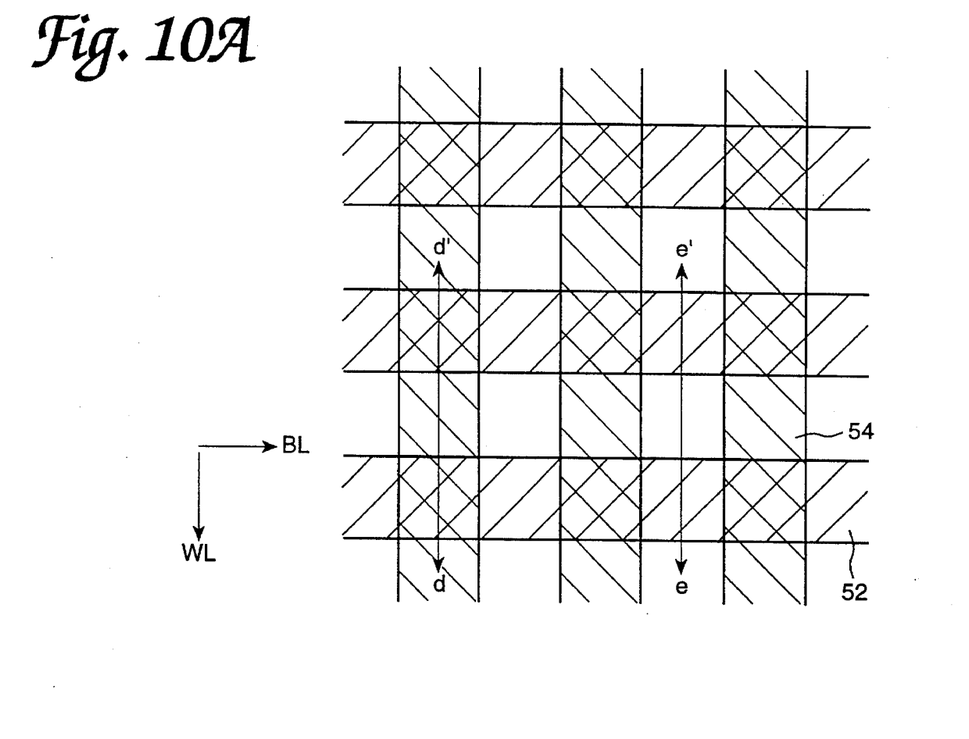
FIG. 10A is a plan view and FIGS. 10B and 10C are cross-sectional views showing the formation of a source region and first and second material layers, taken along lines d-d' and e-e' in FIG. 10A, respectively.
Figure 10B:
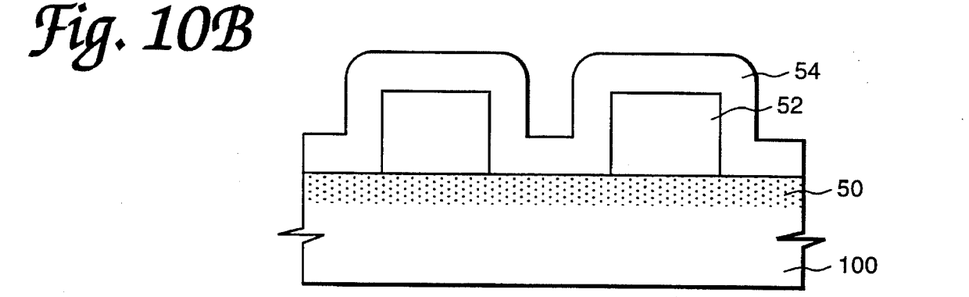
Figure 10C:
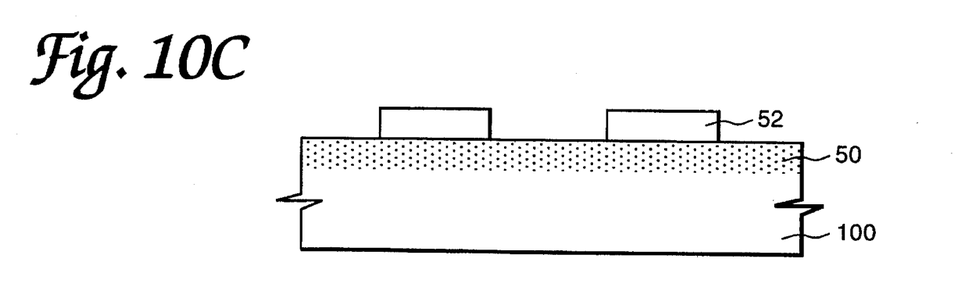

FIGS. 10A is a plan view and FIGS. 10B and 10C are cross-sectional views taken along lines d-d' and e-e' in FIG. 10A, respectively, for illustrating a method for manufacturing a DRAM cell according to the present invention. In FIGS. 10A through 10C, arrow WL indicates a wordline direction and arrow BL indicates a bitline direction.

FIGS. 10A through 10C show the formation of a source region 50, a first material layer 52, and a second material layer 54.

N-type impurity ions are implanted on the entire surface of a first semiconductor substrate 100 of P-type, thereby forming source region 50 of a transistor. Thereafter, an oxide is deposited to a thickness of about 300 nm on first semiconductor substrate 100 wherein source region 50 is formed. The oxide is patterned by a lithography process, thereby forming first material layer 52 extended lengthwise in the bitline direction. Then, an oxide is deposited to a thickness of about 100 nm on the entire surface of the resultant structure wherein first material layer 52 is formed, thereby forming second material layer 54. Next, first material layer 52 and second material layer 54 formed between the neighboring first material layers 52 in the wordline direction are etched to a predetermined depth, e.g., 300 nm, using a mask pattern (not shown) extended lengthwise in the wordline direction.

Figure 11A:
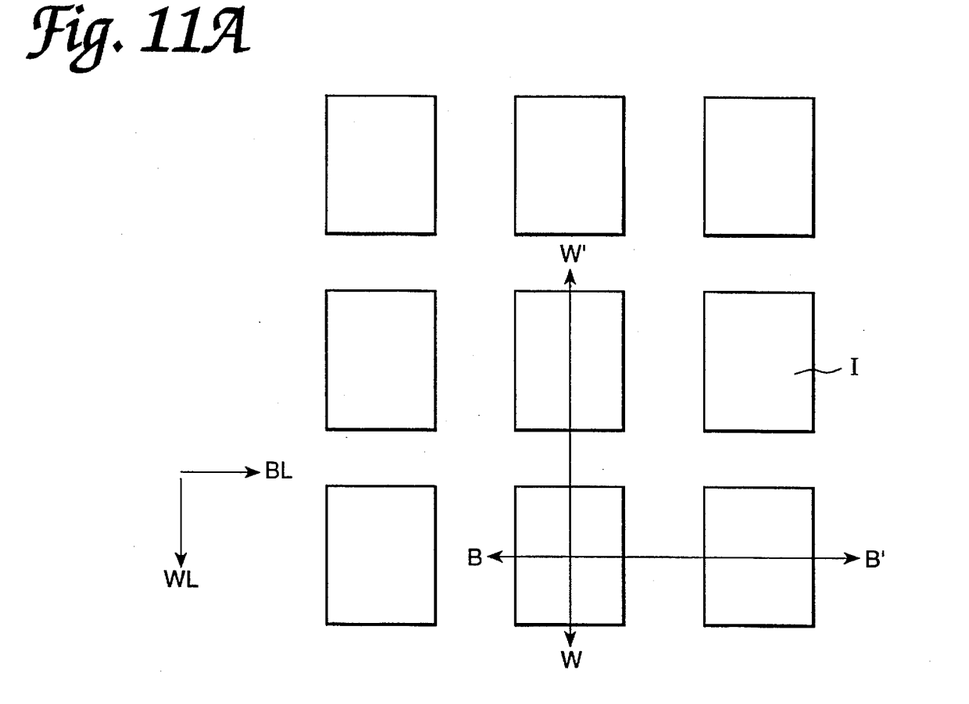
FIG. 11A is a plan view and FIGS. 11B and 11C are cross-sectional views showing the formation of a mask layer, taken along lines W-W' and B-B' in FIG. 11A, respectively.
Figure 11B:
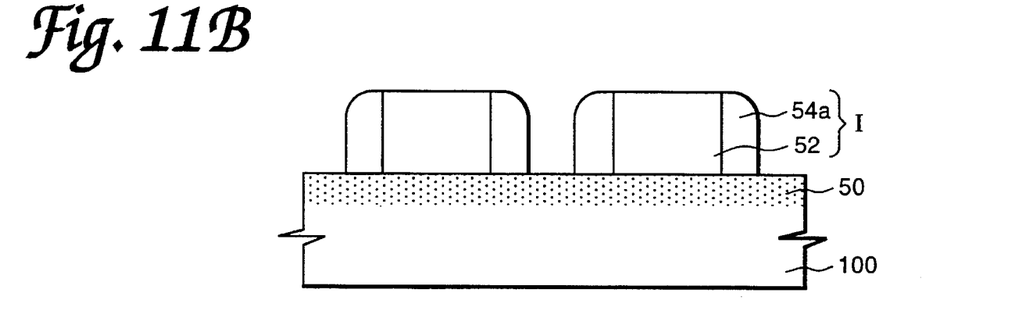
Figure 11C:
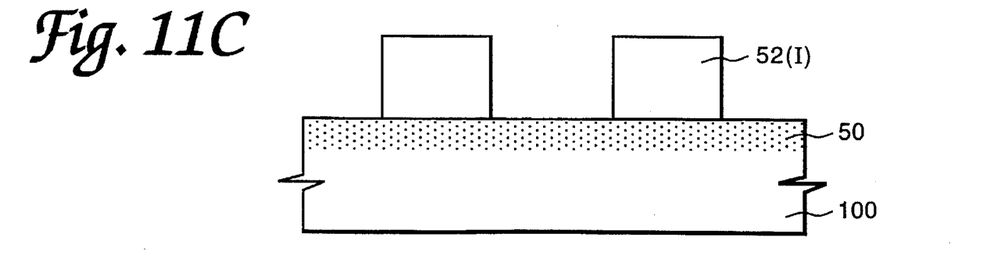

FIGS. 11A to 11C show the formation of a mask layer I, wherein FIG. 11A is plan view and FIGS. 11B and 11C are cross-sectional views taken along lines W-W' and B-B' in FIG. 11A, respectively.

The mask layer I is formed by etching the entire surface of second material layer 54 which is left under the mask pattern again to a depth of about 100 nm, thereby forming spacers 54a composed of the second material layer on both sides of first material layer 52 in the wordline direction, and leaving first material layer 52 only in the bitline direction.

Figure 12A:
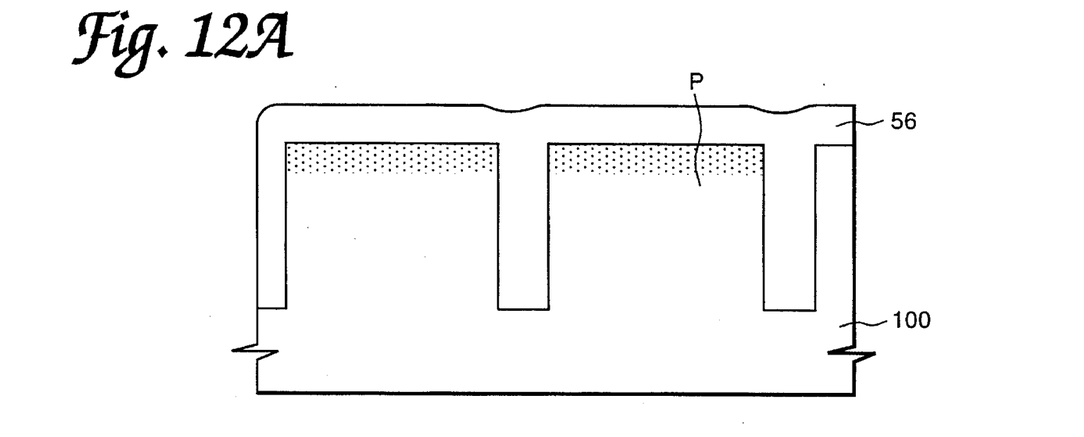
FIGS. 12A and 12B are cross-sectional views showing the formation of a silicon pillar, taken along lines W-W' and B-B' in FIG. 11A, respectively.
Figure 12B:
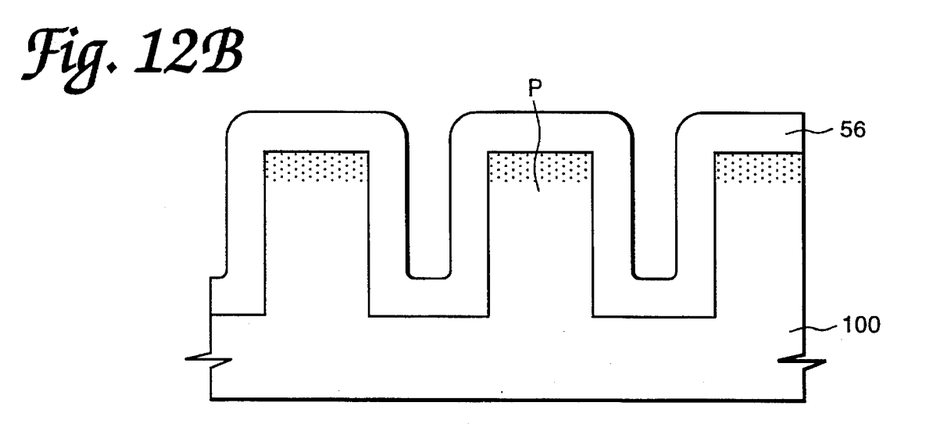

FIGS. 12A and 12B are cross-sectional views taken along lines W-W' and B-B' in FIG. 11A, respectively, and show the formation of a silicon pillar P and a first insulating film 56.

The semiconductor substrate 100 is etched to a predetermined depth, using mask layer I as an etch-mask, thereby forming silicon pillar P having a first spacing in the wordline direction and a second spacing being narrower than the first spacing in the bitline direction. Then, after removing mask layer I completely by a wet etching process, an insulating material, e.g., an oxide, is deposited on the entire surface of the resultant structure. As a result, first insulating film 56 is formed so that it fills the space between pillar P in the wordline direction (see FIG. 12A) and has a groove in the space in the bitline direction (see FIG. 12B).

Figure 13:
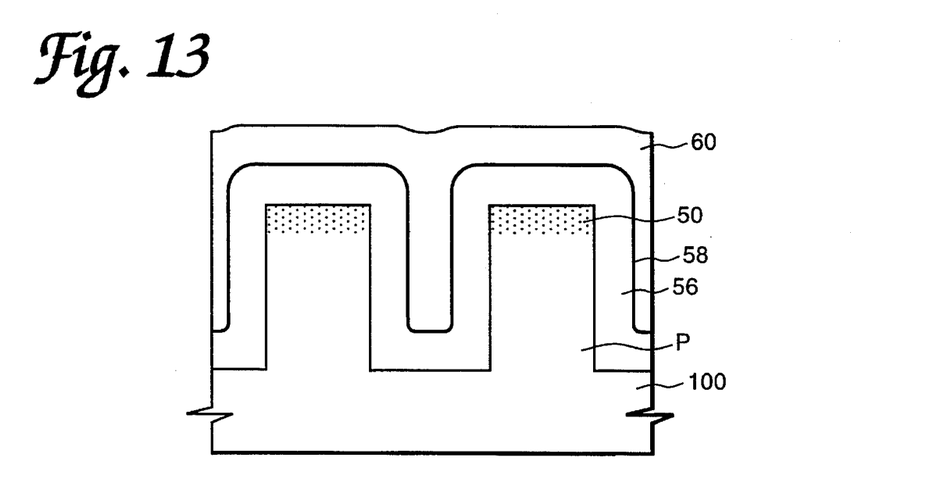
FIG. 13 is a cross-sectional view showing the formation of second and third insulating films, taken along the bitline direction.

FIGS. 13 through 17 are cross-sectional views taken along the bitline direction. FIG. 13 shows the formation of a second insulating film 58 and a third insulating film 60.

An insulating material, e.g., a nitride, is deposited to a thickness of about 10 nm on the entire surface of the resultant structure wherein first insulating film 56 is formed, thereby forming second insulating film 58. Then, an insulating material, e.g., an oxide, is deposited on second insulating film 58, thereby forming third insulating film 60 so as to completely fill the groove between pillars P in the bitline direction.

Figure 14A:
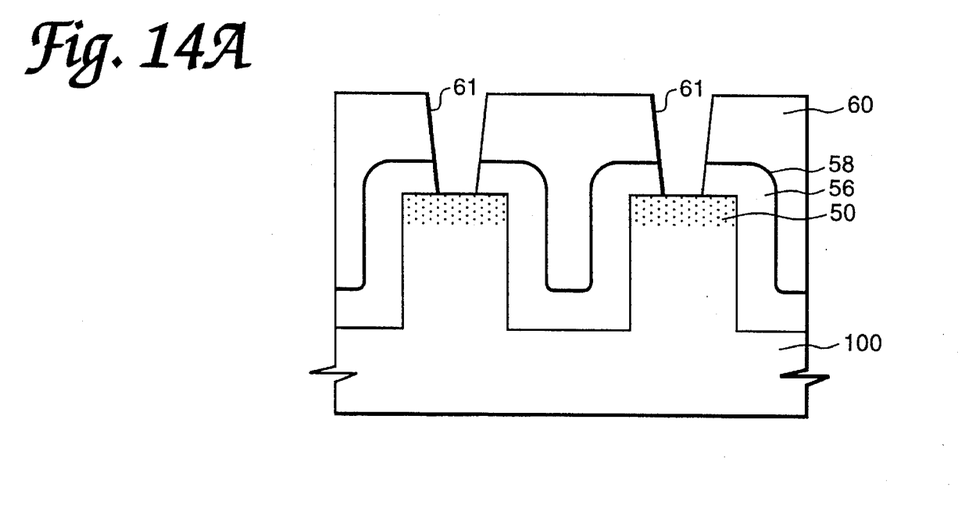
FIGS. 14A through 14F are cross-sectional views showing the formation of a capacitor, a first insulating layer and a second semiconductor substrate, taken along the bitline direction.
Figure 14B:
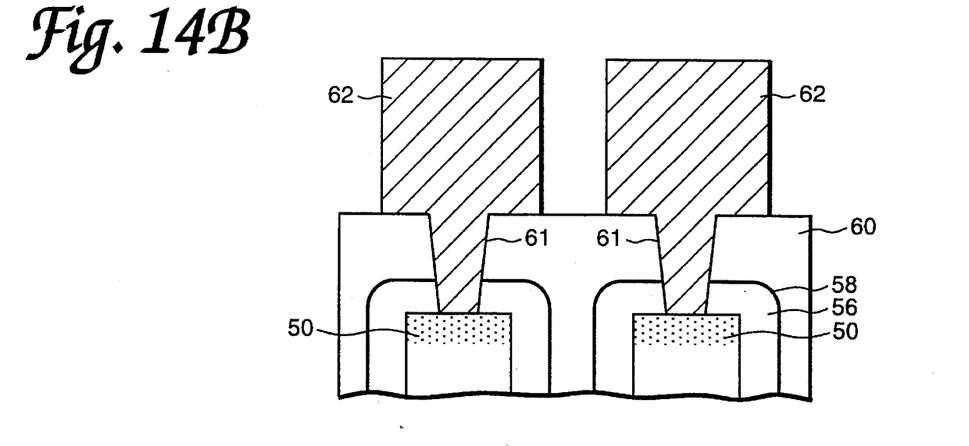
Figure 14C:
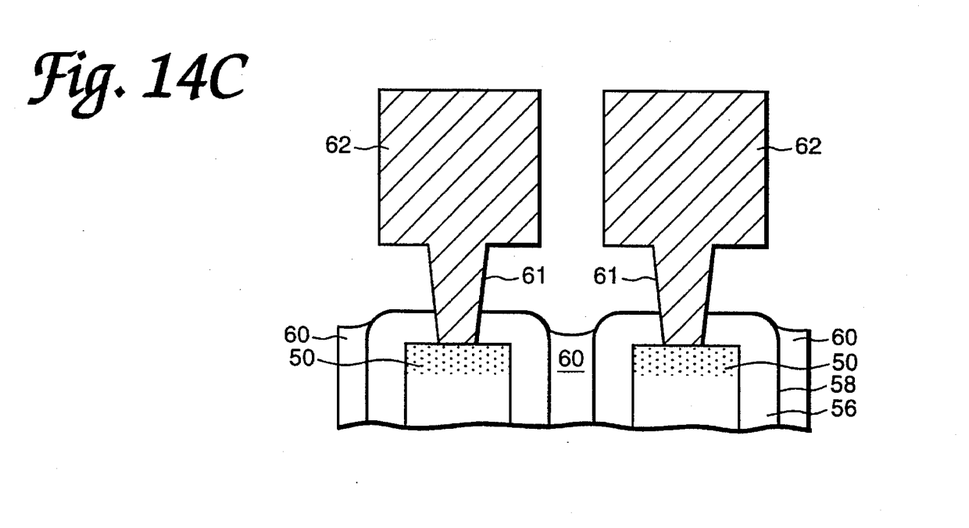
Figure 14D:
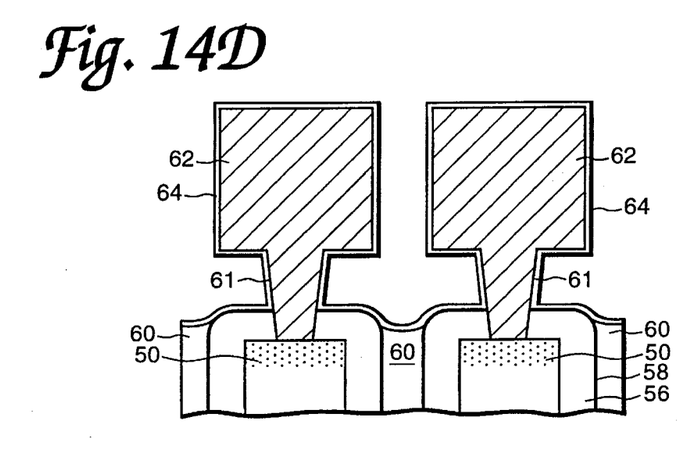
Figure 14E:
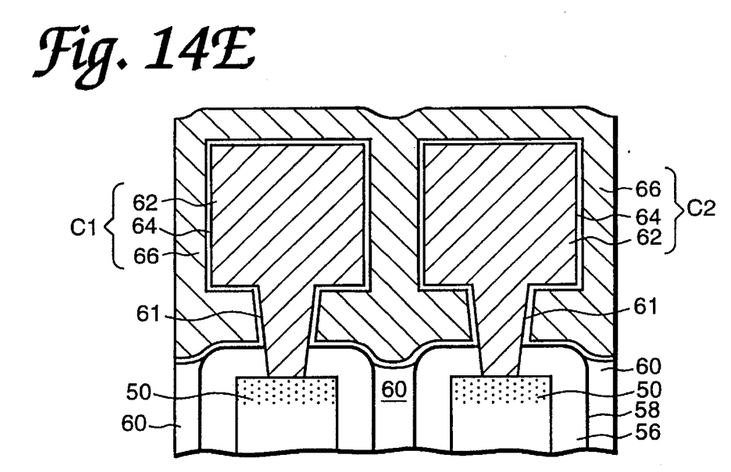
Figure 14F:
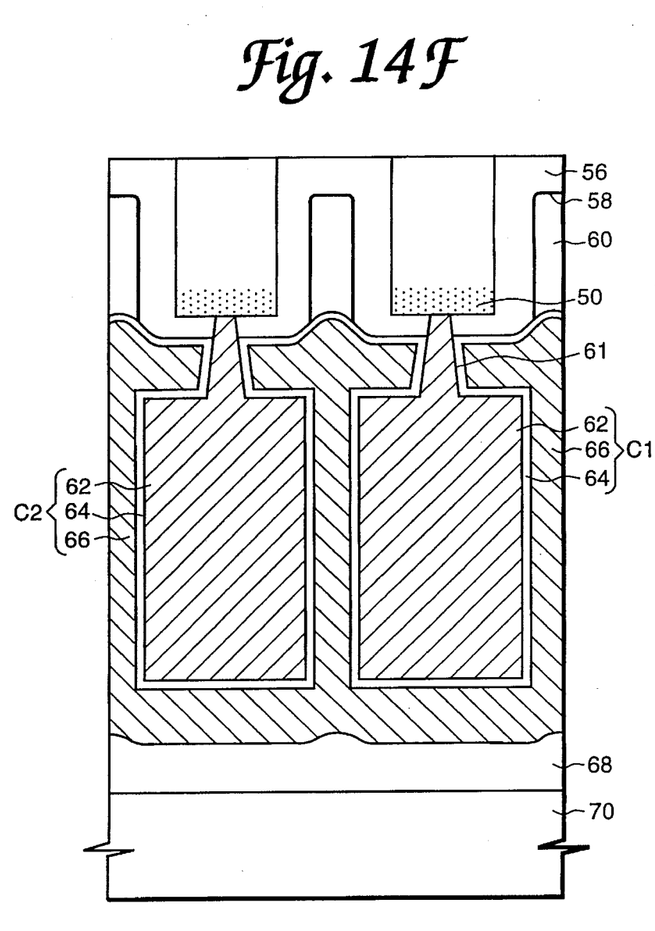

FIGS. 14A through 14F show the formation of capacitors C1, C2, a first insulating layer 68, and a second semiconductor substrate 70. FIG. 14F is inverted relative to FIGS. 14A through 14E.

Referring to FIG. 14A, the third insulating film 60, second insulating film 58 and first insulating film 56 are sequentially etched by a lithography process, thereby forming a first contact hole 61 exposing source region 50. FIG. 14B shows a conductive material deposited on the entire surface of the resultant structure wherein the first contact hole 61 is formed, and is patterned to form each cell unit by a lithography process to thereby form a capacitor storage electrode 62 connected to the source region 50 through the first contact hole 61. A portion of third insulating film 60 is etched by a wet etching process, thereby forming an under-cut portion of storage electrode 62 as shown in FIG. 14C. During the wet etching process, the storage electrode 62 and the second insulating film 58 serve as an etch-mask. Due to the undercut portion, the lower portion of the storage electrode 62 is used as an effective capacitor area, so that the capacitance can be increased. FIG. 14D shows a dielectric film 64 formed on the entire surface of the storage electrode 62. Thereafter, as shown in FIG. 14E, a plate electrode 66 is formed on the entire surface of the storage electrode 62 so as to fill the under-cut portion of the storage electrode 62, thereby completing capacitors C1, C2.

Then, a first insulating layer 68 is formed by depositing an insulating material on plate electrode 66, and the surface of first insulating layer 68 is planarized by a polishing method. Next, a new wafer is attached on the planarized first insulating layer 68 by a direct wafer bonding method, thereby forming second semiconductor substrate 70. Then, after reversing the device so as to turn the back side thereof upward (as shown in FIG. 14F relative to FIG. 14E), the back side of first semiconductor substrate 100 is etched by an etching method such as a grinding/polishing or a plasma etching method until first insulating film 66 is exposed.

Figure 15:
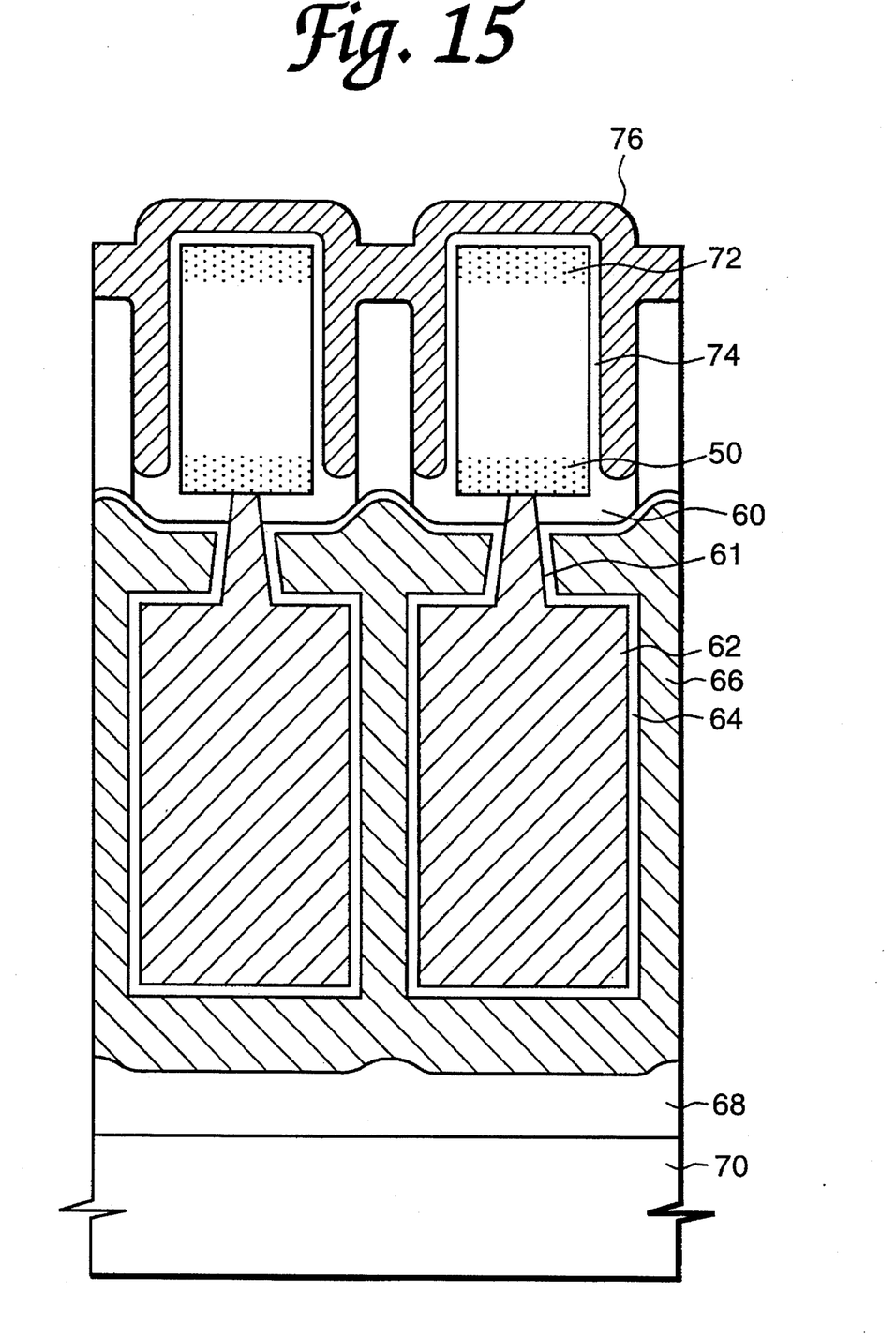
FIG. 15 is a cross-sectional view showing the formation of a drain region and a gate insulating film taken along the bitline direction.

FIG. 15 shows the formation of a drain region 72 and a gate insulating film 74.

N-type impurity ions are implanted on the etched back of first semiconductor substrate 100, thereby forming drain region 72 of the transistor in the upper portion of the pillar as shown in FIG. 15. Thereafter, first insulating film 56 is isotropically etched, thereby exposing the sides of the pillar. During this etching, the second insulating film 58 serves as an etch-blocking layer to prevent the third insulating film 60 from being etched. Then, the gate insulating film 74 is formed by oxidizing the surface of the exposed pillar according to a thermal oxidation process. A conductive material, e.g., an impurity-doped polysilicon, is then deposited on the entire surface of the resultant structure, thereby forming a conductive layer 76.

Figure 16:
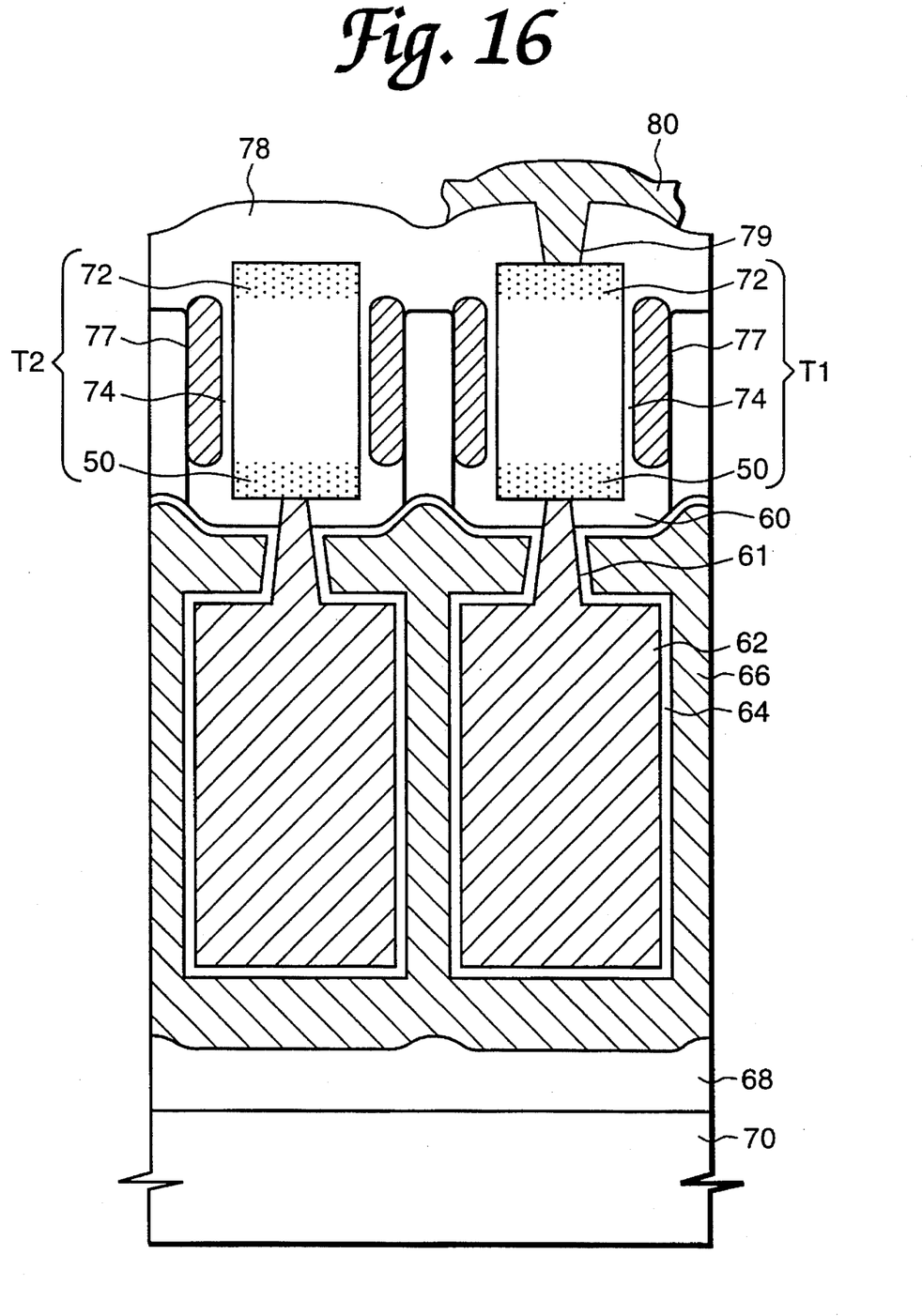
FIG. 16 is a cross-sectional view showing the formation of a gate electrode, a first bitline, and a first bitline contact, taken along the bitline direction.

FIG. 16 shows the formation of a gate electrode 77, a second insulating layer 78, a first bitline contact hole 79 and a first bitline 80.

The conductive layer 76 is etched by an etch-back method, thereby forming a gate electrode surrounding the pillar. As a result, first and second transistors T1, T2 comprised of source region 50, drain region 72 and gate electrode 77 are completed. Thereafter, an insulating material is deposited on the entire surface of the resultant structure wherein first and second transistors T1, T2 are formed, thereby forming a second insulating layer 78. Then, second insulating layer 78 is etched by a lithography process, thereby forming a first bitline contact hole 79. Then, a conductive material is deposited on the entire surface of the resultant structure wherein the first bitline contact hole 79 is formed, and is patterned by a lithography process, thereby forming first bitline 80 being connected with drain region 72 of first transistor T1 through the first bitline contact hole 79.

Figure 17:
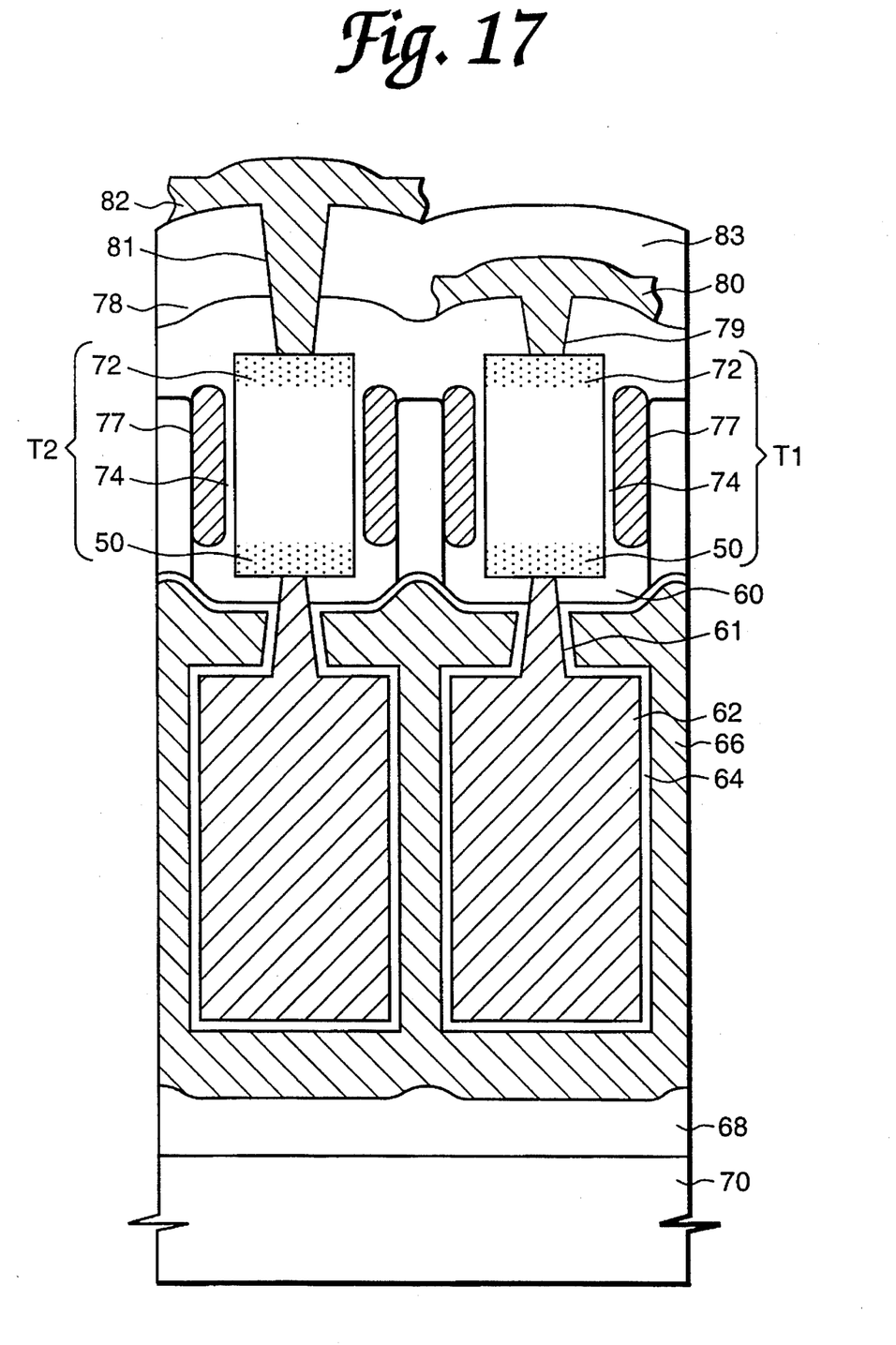
FIG. 17 is a cross-sectional view showing the formation of a second bitline contact and a second bitline, taken along the bitline direction.

FIG. 17 shows the formation of a second bitline contact hole 81 and a second bitline 82. An insulating material is deposited on the entire surface of the resultant structure wherein first bitline 80 is formed, thereby forming a third insulating layer 83. Thereafter, the third insulating layer 83 and the second insulating layer 78 are etched by a lithography process, thereby forming the second bitline contact hole 81. Then, a conductive material is deposited on the entire surface of the resultant structure wherein the second bitline contact hole 81 is formed and is patterned by a lithography process, thereby forming second bitline 82 being connected with drain region 72 of second transistor T2 through the second bitline contact hole 81. As a result, a multi-layered bitline composed of first and second bitlines 80 and 82 is completed.

According to the above-described method for manufacturing a DRAM cell of the present invention, since the capacitor, the transistor and the bitline contact hole are formed vertically with respect to one another, the memory cell area is remarkably reduced. Also, since the capacitor area is greatly increased without increasing the cell area and the step-difference, the capacitance required for highly integrated semiconductor devices such as 256 Mbit devices and beyond is sufficiently achieved.

According to the present invention as described above, a pillar, which is vertically formed on a semiconductor substrate, serves as a channel region of a transistor, and source and drain regions are formed in upper and lower portions of the pillar. A gate electrode surrounding the pillar is formed in a self-alignment fashion. Therefore, the area occupied by the transistor is remarkably reduced. Also, the transistor according to the present invention is vertically formed on a capacitor and a bitline contact hole is vertically formed on the transistor. Thus, the memory cell area can likewise be remarkably reduced.

It will be understood by those skilled in the art from the foregoing description of a preferred embodiment of the disclosed device that various changes and modifications may be made in the invention without departing from the spirit and scope thereof.

What is claimed is:

1. A method for manufacturing a plurality of MOS transistors comprising steps of:

forming a first impurity region of said plurality of MOS transistors in a surface of a first semiconductor substrate;

forming a plurality of silicon pillars by etching said first semiconductor substrate;

filling a space between said plurality of silicon pillars with an insulator;

forming a plurality of first contact holes each for respective ones of said plurality of silicon pillars by etching said insulator;

forming a first electrode on said insulator, said first electrode being connected to said first impurity region of said plurality of MOS transistors through said plurality of first contact holes;

forming a first insulating layer on a surface of a resultant structure of said step of forming a first electrode;

planarizing a surface of said first insulating layer;

attaching a second semiconductor substrate on said planarized surface of said first insulating layer;

etching a back side of said first semiconductor substrate;

forming a second impurity region in a first end surface of said plurality of silicon pillars;

exposing a second end surface of said plurality of silicon pillars by partially etching said insulator;

forming a gate insulating film so as to surround each of said plurality of silicon pillars; and forming a gate electrode so as to surround each of said plurality of silicon pillars and said gate insulating film.

2. The method for manufacturing a plurality of MOS transistor according to claim 1, wherein said step of forming said gate electrode comprises steps of:

forming a conductive material layer by depositing a conductive material on a resultant structure of said step of forming said gate insulating film; and forming said gate electrode so as to surround each of said plurality of silicon pillars by etching a surface of said conductive material layer in a self-alignment fashion.

3. The method for manufacturing plurality of a MOS transistors according to claim 1, further comprising, after said step of forming said gate electrode, steps of:

forming a second insulating layer on a surface of a resultant structure of said step of forming said gate electrode;

forming a second contact hole by etching said second insulating layer; and forming a second electrode on said second insulating layer, said second electrode being connected to said second impurity region through said second contact hole.

4. The method for manufacturing plurality of a MOS transistors according to claim 1, wherein said step of etching said back side of said first semiconductor substrate is performed until said insulator is exposed.

5. A method for manufacturing plurality of a MOS transistor according to claim 1, wherein said step of filling said space between said plurality of silicon pillars includes a step of providing said insulator comprised of at least two materials.

6. A method for manufacturing a semiconductor memory device comprising steps of:

forming a first impurity region in a surface of a first semiconductor substrate;

forming a plurality of silicon pillars by etching said first semiconductor substrate;

filling a space between said plurality of silicon pillars with an insulator;

forming a first contact hole by etching said insulator;

forming a capacitor on said insulator comprising:
a storage electrode connected to said first impurity region through said first contact hole,
a dielectric film on said storage electrode, and a plate electrode; forming a first insulating layer on a surface of a resultant structure of said step of forming said capacitor;

planarizing a surface of said first insulating layer;

attaching a second semiconductor substrate to said planarized surface of said first insulating layer;

etching a back side of said first semiconductor substrate;

forming a second impurity region in an end surface of said plurality of silicon pillars;

exposing said plurality of silicon pillars by partially etching said insulator;

forming a gate electrode surrounding each of said plurality of silicon pillars to serve as a wordline;

forming a second insulating layer on a surface of a resultant structure of said step of forming said gate electrode;

forming a second contact hole by etching said second insulating layer; and forming a bitline on said second insulating layer, said bitline being connected to said second impurity region through said second contact hole.

7. The method for manufacturing a semiconductor memory device according to claim 6 wherein said step of forming said plurality of silicon pillars comprises steps of:

forming a first material layer on said first semiconductor substrate, said first material layer being extended lengthwise in a bitline direction;

forming a second material layer on a surface of a resultant structure of said step of forming said first material layer;

forming a mask pattern on said second material layer in a wordline direction, said wordline direction being substantially perpendicular to said bitline direction;

etching said second material layer and said first material layer;

etching a surface of said second material layer remaining under said mask pattern to form a mask layer; and etching said first semiconductor substrate using said mask layer as an etch-mask, to thereby form said plurality of silicon pillars having a first spacing in said wordline direction and a second spacing being narrower than said first spacing in said bitline direction.

8. The method for manufacturing semiconductor memory device according to claim 6, wherein said step of filling said space between said plurality of silicon pillars with said insulator comprises steps of:

forming a first insulating film filling a first portion said space between said plurality of silicon pillars in said wordline direction and not filling a second portion of said space between said plurality of silicon pillars in said bitline direction, by depositing an insulating material on a surface of a resultant structure of said step of forming said plurality of silicon pillars;

forming a second insulating film on said first insulating film; and forming a third insulating film so as to completely fill said second portion of said space between said plurality of silicon pillars in said bitline direction by depositing an insulating material on said second insulating film.

9. The method for manufacturing a semiconductor memory device according to claim 6, wherein said step of forming said capacitor comprises steps of:

forming a capacitor storage electrode patterned to each cell unit on a resultant structure of said step of forming said first contact hole;

forming an under-cut portion of said storage electrode by removing a portion of said insulator in a wet etching process;

forming a dielectric film on a surface of said storage electrode; and forming a plate electrode on said dielectric film.

* * * * *